United States Patent [19]
Morita et al.

[11] Patent Number: 6,016,599
[45] Date of Patent: Jan. 25, 2000

[54] DEVICE AND METHOD FOR MOUNTING ELECTRONIC PARTS

[75] Inventors: Takeshi Morita, Chikushino; Yasuhiro Kashiwagi, Maebaru, both of Japan

[73] Assignee: Matsushita Electric Industrial Co., Ltd., Osaka, Japan

[21] Appl. No.: 08/875,348

[22] PCT Filed: Nov. 21, 1996

[86] PCT No.: PCT/JP96/03412

§ 371 Date: Nov. 25, 1997

§ 102(e) Date: Nov. 25, 1997

[87] PCT Pub. No.: WO97/20456

PCT Pub. Date: May 6, 1997

[30] Foreign Application Priority Data

Nov. 29, 1995 [JP] Japan ..................................... 7-310502

[51] Int. Cl.[7] ........................................................ H05K 3/30
[52] U.S. Cl. ................................ 29/833; 29/720; 29/740; 29/759; 414/730; 901/40; 901/47
[58] Field of Search .............................. 29/833, 825, 740, 29/720, 759; 414/730; 901/40, 47

[56] References Cited

U.S. PATENT DOCUMENTS

| | | |
|---|---|---|
| 4,805,110 | 2/1989 | Takahashi . |
| 4,979,290 | 12/1990 | Chiba ..................................... 29/833 K |
| 4,980,971 | 1/1991 | Bartschat et al. . |
| 5,084,962 | 2/1992 | Takahashi et al. . |
| 5,212,881 | 5/1993 | Nishitsuka et al. ........................ 29/740 |
| 5,729,895 | 3/1998 | Kim .......................................... 29/833 |
| 5,787,577 | 8/1998 | Kent .......................................... 29/833 |

FOREIGN PATENT DOCUMENTS

| | | |
|---|---|---|
| 63-74530 | 4/1988 | Japan . |
| 4-346300 | 2/1992 | Japan . |
| 4-196546 | 7/1992 | Japan . |
| 4-340799 | 11/1992 | Japan . |
| 6-326496 | 11/1994 | Japan . |
| 7-175522 | 7/1995 | Japan . |

OTHER PUBLICATIONS

IBM Tech Discl Bull vol. 29 No. 11 Apr. 1987 pp. 4960–4962.

*Primary Examiner*—Carl J. Arbes
*Attorney, Agent, or Firm*—McDermott, Will & Emery

[57] ABSTRACT

An electronic components mounting machine comprising an actuator(7), whereby electronic components are mounted on a substrate, a camera(5) whereby coordinates of recognition marks formed on the substrate at four places at least, are detected, a controller(6) whereby actuator(7) is controlled, a mounting data table(9) wherein information on mounting coordinates and mounting angles of electronic components to be mounted is stored, and a correction data table(10) wherein information on correction values to be applied to the mounting coordinates and mounting angles in reference to the substrate, on which the electronic components are mounted, is stored, and characterized in that the correction data table(10) stores information on correction values for each respective cell, which is formed by dividing the substrate into a plurality of small sections according to a specified rule in reference to the coordinates of recognition marks detected by the camera(5), thus enabling to mount each respective electronic component in accordance with the information on the mounting coordinates and mounting angles stored in the mounting data table(9) after the information is corrected according to the information on correction values stored in the correction data table(10) for each respective cell, where a corresponding electronic component is mounted.

14 Claims, 7 Drawing Sheets

R (i, j) CELL

S (i, j) CELL

FIG. 4

MOUNTING SEQUENCE — SN
MOUNTING COORDINATES — (x, y)
MOUNTING ANGLE — $\psi$
CELL SUBSCRIPT — (i, j)

| SN | (x, y) | $\psi$ | (i, j) | OTHERS |
|---|---|---|---|---|
| 1 | (10, 10) | 90 | (20, 21) | |
| 2 | (15, 20) | 0 | (92, 83) | |
| ⋮ | ⋮ | ⋮ | ⋮ | |

CORRECTION DATA TABLE

| j \ i | 1 | 2 |
|---|---|---|
| 1 | $\varepsilon x(1,1), \varepsilon y(1,1), \varepsilon \theta(1,1)$ | $\varepsilon x(1,2), \varepsilon y(1,2), \varepsilon \theta(1,2)$ |
| 2 | $\varepsilon x(2,1), \varepsilon y(2,1), \varepsilon \theta(2,1)$ | $\varepsilon x(2,2), \varepsilon y(2,2), \varepsilon \theta(2,2)$ |
| 3 | $\varepsilon x(3,1), \varepsilon y(3,1), \varepsilon \theta(3,1)$ | $\varepsilon x(2,3), \varepsilon y(2,3), \varepsilon \theta(2,3)$ |

10

_6,016,599_

DEVICE AND METHOD FOR MOUNTING ELECTRONIC PARTS

FIELD OF THE INVENTION

The present invention relates to an electronic components mounting machine and a mounting method of electronic components. Especially, the present invention is characterized in that electronic components are mounted on a substrate by applying a correction to mounting operations according to deformations of the substrate.

BACKGROUND OF THE INVENTION

In general, almost all the electronic components mounting machines have so far been provided with capabilities of applying a correction to mounting operations according to deformations observed on a substrate where electronic components are mounted.

Such a correction applied to prior art electronic components mounting machines will be explained with reference to FIG. 8.

In FIG. 8(a), recognition marks 2 and 3 are located on each of two corners of a substrate 1, respectively, where the two corners are situated diagonally opposite to each other. With a prior art electronic components mounting machine, when the substrate 1 is deformed from an ideal configuration as indicated by solid lines in FIG. 8(a) to a configuration indicated by dotted lines, the position of the recognition mark 3 is shifted accordingly. A constant deformation ratio is obtained by calculation from the magnitude of shifting of the recognition marks 2 and 3 and a correction is applied to mounting positions of the electronic components mounting machine by the use of the deformation ratio. In this case, however, it is assumed that the deformation of the substrate 1 is taking place uniformly in both the X and Y directions as illustrated in FIG. 8(a).

When deformations appear nonuniformly in the X and Y directions as shown in FIG. 8(b), the two recognition marks 2 and 3 do not provide correct information on the deformations, thereby not allowing the derived deformation ratio to represent the actual deformations of the substrate 1. Particularly, as large size substrates are used more and more recently, the adverse effect of nonuniform deformations is no longer neglected.

Thus, the prior art electronic components mounting machines have presented a problem of inability to cope sufficiently with the deformations of substrates when large size substrates are used and/or a high precision mounting performance is required of electronic components mounting machines.

SUMMARY OF THE INVENTION

The object of the present invention is to provide an electronic mounting machine whereby a high precision mounting performance is achieved through a proper process of correction employed against whatever deformations applied to substrates.

An electronic component mounting machine of the present invention comprises an actuator for mounting electronic components on a substrate, a detector for identifying recognition marks that are located at least on four places of the substrate and detecting coordinates of the recognition marks, a controller to control the foregoing actuator, a mounting data table for storing information on mounting coordinates and mounting angles of the electronic components to be mounted and a correction data table for storing information on correction values to be applied to the foregoing mounting coordinates and mounting angles in reference to the substrate, on which electronic components are mounted, wherein the foregoing correction data table stores information on correction values for each respective cell formed by dividing the substrate into a plurality of small sections according to a specified rule in reference to the coordinates of at least four recognition marks and the information on the mounting coordinates and angles stored in the foregoing mounting data table is corrected by the information on correction values stored in the foregoing correction data table corresponding to a cell on the substrate where a specific electronic component is mounted, thereby mounting of the foregoing electronic components being successfully performed.

In the structure as described in the above, a substrate is divided into a plurality of cells by a specified rule, information on correction values is decided for each respective cell and is stored in a correction data table. At this time, these cells are formed according to the coordinates of recognition marks that are formed on at least four places of the substrate.

Therefore, when the substrate is deformed nonuniformly in the X and Y directions that are perpendicular to each other, each respective cell presents a configuration reflecting the foregoing nonuniform deformation. Since correction values are obtained for each respective cell in accordance with these deformations, a correction is made to match each respective nonuniform deformation.

BRIEF DESCRIPTION OF THE DRAWINGS

FIG. 4 shows the content of a mounting data table in a preferred embodiment of the present invention.

FIG. 5 shows the content of a correction data table in a preferred embodiment of the present invention.

PREFERRED EMBODIMENTS OF THE INVENTION

Next, a preferred embodiment of the present invention will be explained with reference to drawings.

Figure 1:
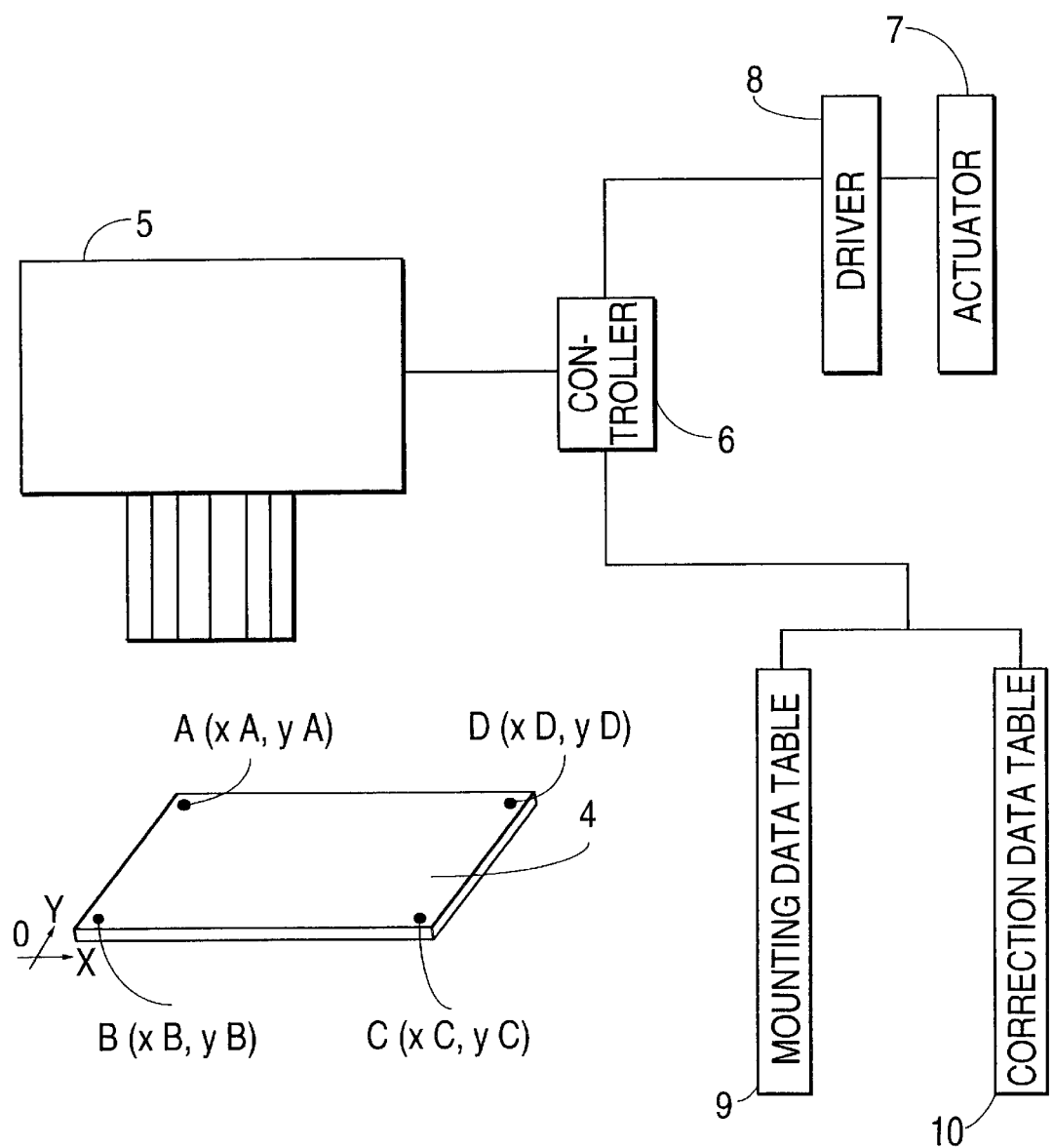
FIG. 1 is a block diagram of an electronic components mounting machine in a preferred embodiment of the present invention.

FIG. 1 is a block diagram of an electronic components mounting machine in a preferred embodiment of the present invention.

In FIG. 1, a reference numeral 4 indicates a master substrate having no deformations, reference symbols A, B, C and D indicate recognition marks located on the four corners of the master substrate 4, respectively, and (xA, yA) is the coordinate of the recognition mark A and similarly (xB, yB), (xC, yC) and (xD, yD) are the coordinates of the recognition marks B, C and D, respectively.

In consideration of a rectangular configuration usually employed with a substrate, the conditions of xA=xB, xC=xD, yA=yD and yB=yD are established.

A reference numeral 5 indicates a video camera for observing the master substrate 4, and each respective coordinate as mentioned in the above is obtained from the video images taken by the video camera 5.

Alternatively, the foregoing coordinates may be decided by the design values of the substrate without relying on the master substrate 4.

A reference numeral 6 indicates a controller that controls a driver 8 for driving an actuator 7 whereby mounting of electronic components is performed.

A reference numeral 9 indicates a mounting data table, wherein information on mounting coordinates and angles relative to electronic components to be mounted is stored, and a reference numeral 10 indicates a correction data table, wherein correction values for each respective cell formed by dividing a substrate into small sections vertically and horizontally are stored.

Figure 2:
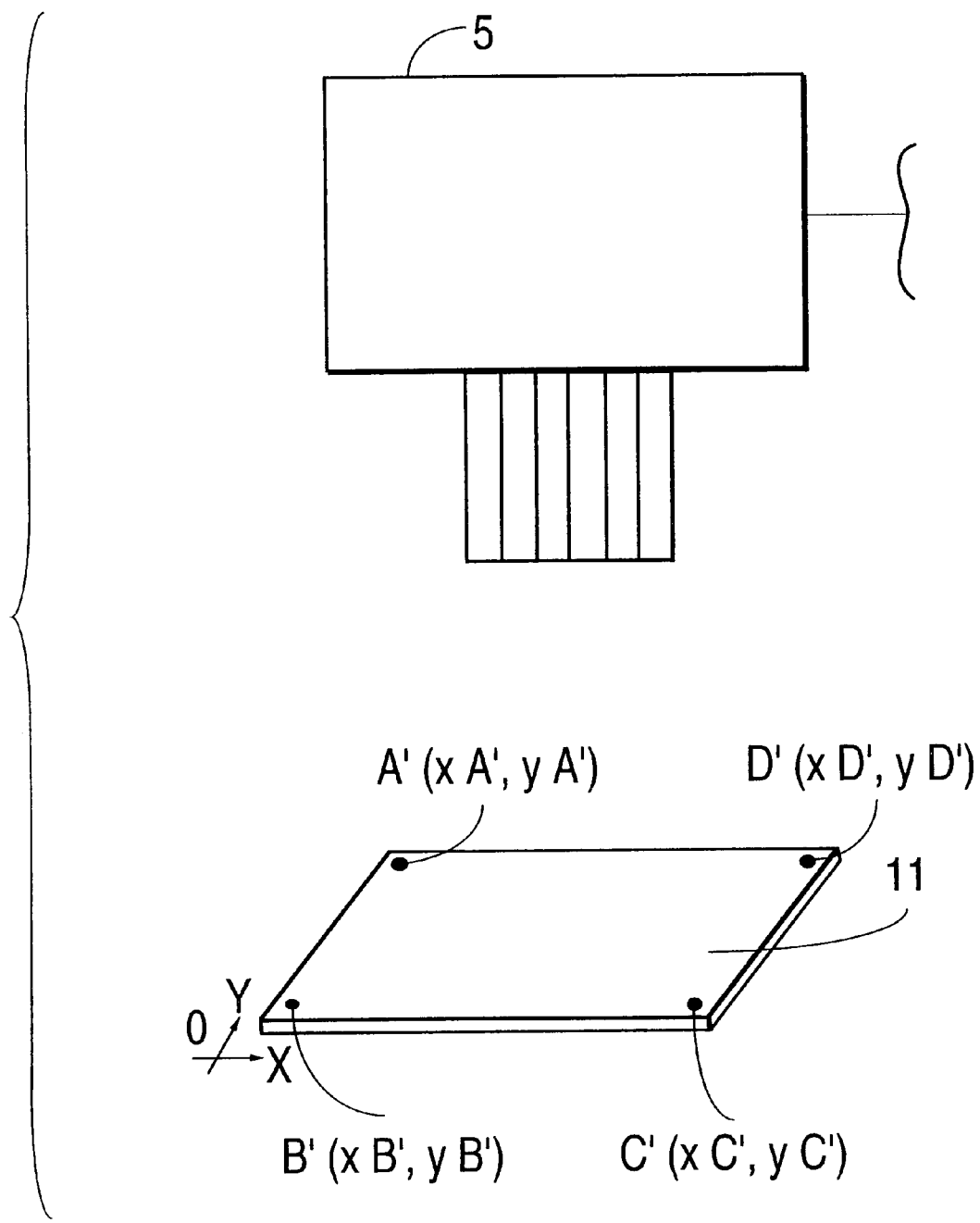
FIG. 2 is another block diagram of an electronic components mounting machine in a preferred embodiment of the present invention.

In FIG. 2, how a substrate 11 to be mounted with electronic components, not the master substrate 4, is observed by means of the video camera 5 is illustrated.

The substrate 11 is usually deformed nonuniformly in the X and Y directions, and accordingly the coordinates (xA', yA'), (xB', yB'), (xC', yC') and (xD', yD') corresponding to recognition marks A', B', C' and D', respctively, and formed on each of the four corners of the substrate 11 are deviated from the coordinates of corresponding recognition marks on the master substrate 4.

Figure 3:
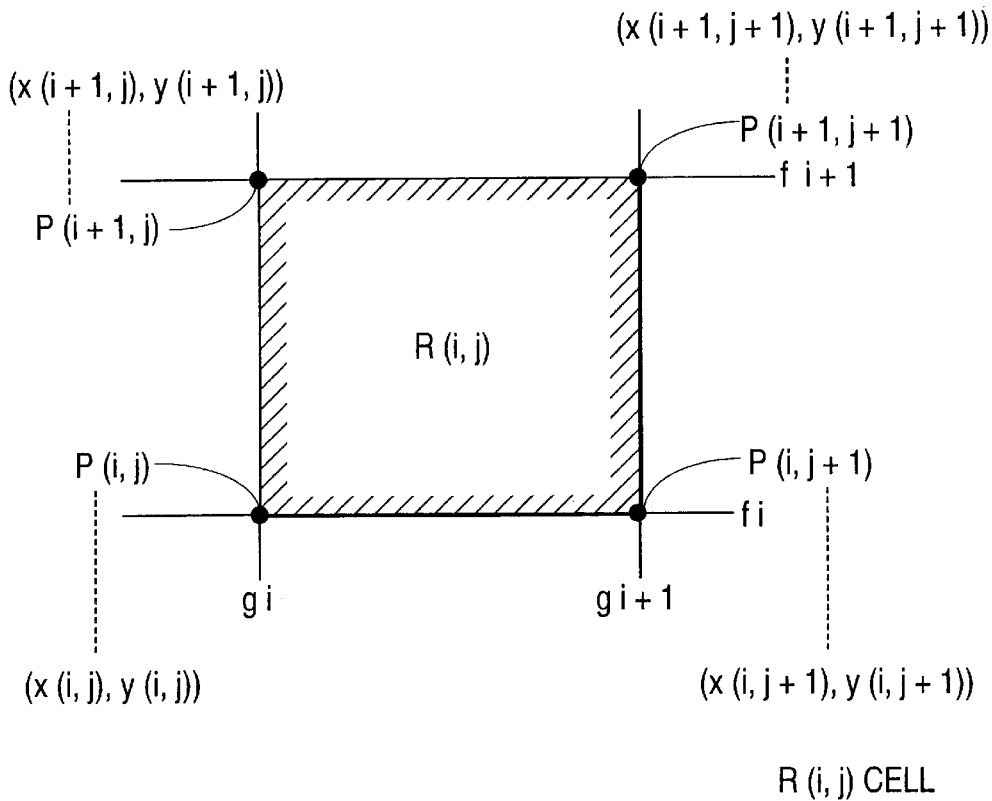
FIG. 3(a) is a drawing to describe cells of a master substrate in a preferred embodiment of the present invention.
FIG. 3(b) is a drawing to describe cells of a substrate in a preferred embodiment of the present invention.
Figure 3:
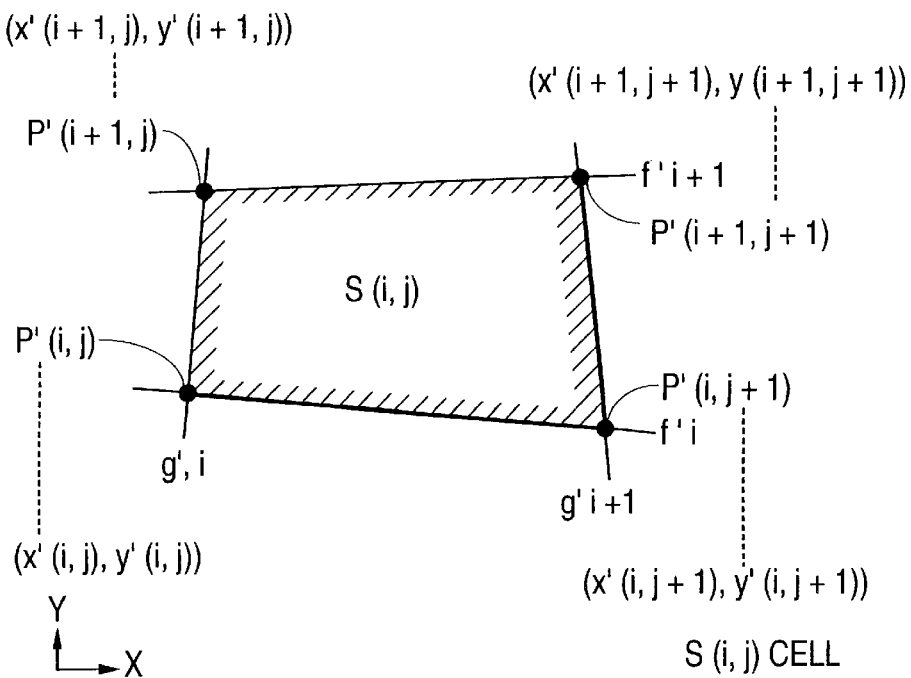

Next, the positional relationship and correction values at each respctive cell will be explained with reference to FIG. 3.

A system of notation employing subscripts i (i=1, 2, 3, . . . m, m+1) and j (j=1, 2, 3 . . . n, n+1), where m and n are integers, is introduced here.

Suppose there is a square cell formed by surrounding with line segments gi, gi+1, each of which is formed by connecting between a point made by dividing a side AD or side BC of the master substrate 4 equally by m and its neighboring point and line segments fi, fi+1, each of which is formed by connecting between a point made by dividing a side AB or side DC of the master substrate 4 equally by n and its neighboring point.

Since the square ABCD is rectangular on the master substrate 4, the cell surrounded by the line segments gi, gi+1 and line segments fi, fi+1 is also rectangular. Also suppose that a cell R(i, j) with notation of subscripts (i, j) has four corner points P(i, j), P(i, j+1), P(i+1, j) and P(i+1, j+1) as shown in FIG. 3.

In addition, the coordinate of the corner point P(i, j) is expressed by (x (i, j), y (i, j)).

When the virtual coordinate of this coordinate system's origin is considered as (x (0, 0), y (0, 0)), the equation whereby the coordinate of the corner point P(i, j) is derived from the coordinates of the recognition marks A, B, C and D is generally expressed as follows:

$$x(i, j) = \frac{\begin{array}{c}(x(i, m) - x(i, 0))(x(n, j)y(0, j) - x(0, j)y(n, j) - \\ (x(n, j) - (x(0, j))(x(i, m)y(i, m) - x(i, 0)y(i, m))\end{array}}{\begin{array}{c}(y(i, m) - y(i, 0))(x(n, j) - x(0, j)) - \\ (y(n, j) - y(0, j))(x(i, m) - x(i, 0))\end{array}}$$

$$y(i, j) = \frac{\begin{array}{c}(x(i, m)y(i, 0) - x(i, 0)y(i, m))(y(n, j) - \\ y(0, j) - (x(n, j)y(0, j) - x(0, i)y(n, j))(y(i, m)y(i, 0))\end{array}}{\begin{array}{c}(y(n, j) - y(0, j))(x(i, m) - x(i, 0)) - \\ (y(i, m) - y(i, 0))(x(n, j) - x(0, j)\end{array}},$$

wherein $(x(0, j), y(0, j))=((xA-xB)j/m+xB, (yA-yB)j/m+yB)$ $(x(n, j), y(n, j))=((xD-xC)j/m+xC, (yD-yC)j/m+yC)$ $(x(i, 0), y(i, 0))=((xC-xB)j/n+xB, (yC-yB)j/n+yB)$ $(x(i, m), y(i, m))=((xD-xA)j/n+xA, (yD-yA)j/n+yA)$ and in the case of a rectangle that serves as a basis for the present exemplary embodiment, $(x(0, j), y(0, j))=(xB, (yA-yB)j/m+yB)$ $(x(n, j), y(n, j))=(xC, (yD-yC)j/m+yC)$ $(x(i, 0), y(i, 0))=((xC-xB)j/n+xB, yB)$ $(x(i, m), y(i, m))=((xD-xA)j/n+xA, yA)$  (Equation 1)

Also, in connection with a substrate 11, suppose there is a square cell S (i, j) formed by surrounding with line segments g'i, g'i+1, each of which is formed by connecting between a point made by dividing a side A'D' or side B'C' of the substrate 11 equally by m and its neighboring point and line segments fi, fi+1, each of which is formed by connecting between a point made by dividing a side A'B' or side D'C' of the substrate 11 equally by n and its neighboring point.

The cells S (i, j) are in a one-to-one correspondence with the cells R (i, j).

However, since the square A'B'C'D is not usually rectangular due to deformations of the substrate 11, the cell S (i, j) differs from the cell R (i, j) in not showing a rectangular configuration as shown in FIG. 3(b).

As in the case of the cell R (i, j), suppose the cell S (i, j) has four corner points P'(i, j), P'(i+1, j), P'(i, j+1) and P'(i+1, j+1), and the coordinate of the corner point P'(i, j) is expressed by (x'(i, j), y'(i, j)). The coordinate of the corner point P'(i, j) can also be derived from the coordinates of the recognition marks A', B', C' and D' by using an equation that is similar to (Equation 1).

In the present exemplary embodiment, the correction value ε in the horizontal direction is defined as a mean value of shifting values (Δx, Δy) of the four corner points of the cell S (i, j) that correspond to the four corner points of the cell R (i, j). respectively.

When the correction value of the cell S (i, j) in the X direction against the cell R (i, j) is εx(i, j) and the correction value in the Y direction is a εy(i, j), the correction values εx(i, i) and εy(i, j) can be obtained from the following equation:

$εx(i, j)=(Δx(i, j)+Δx(i, j+1)+Δx(i+1, j)+Δx(i+1, j+1)/4$ $εy(i, j)=(Δy(i, j)+Δy(i, j+1)+Δy(i+1, j)+Δy(i+1, j+1)/4$ wherein $$(\Delta x(i, j), \Delta y(i, j))=(x'(i, j)-x(i, j), y'(i, j)-y(i, j))$$

$$(\Delta x(i, j+1), \Delta y(i, j+1))=(x'(i, j+1)-x(i, j+1), y'(i, j+1)-y(i, j+1))$$

$$(\Delta x(i+1, j), \Delta y(i+1, j))=(x'(i+1, j)-x(i+1, j), y'(i+1, j)-y(i+1, j))$$

$$(\Delta x(i+1, j+1), \Delta y(i+1, j+1))=(x'(i+1, j+1)-x(i+1, j+1), y'(i+1, j+1)-y(i+1, j+1)) \quad \text{(Equation 2)}$$

Further, in the present exemplary embodiment, the rotational correction value $\epsilon\theta$ of the cell S (i, j) is defined as a mean value of rotational shifts a $\Delta\theta$ of the four line segments that correspond to the four line segments surrounding the cell R (i, j).

In connection with the rotational direction ($\theta$ direction), the correction value $\epsilon\theta$ (i, j) to be applied to the cell S (i, j) against the cell R (i, j) can be obtained from the following equation:

$$\epsilon\theta(i, j)=(\Delta\theta fi+\Delta\theta fi+1+\Delta\theta gi+\Delta\theta gi+1)/4$$

, wherein $f(VA, VB)=ATN(VA, VB)$ $$(x(0, j), y(0, j))=((xA-xB)j/m+xB, (yA-yB)j/m+yB)$$

$$(x(n, j), y(n, j))=((xD-xC)j/m+xC, (yD-yC)j/m+yC)$$

$$(x(i, 0), y(i, 0))=((xC-xB)i/n+xB, (yC-yB)j/n+yB)$$

$$(x(i, m), y(i, m))=((xD-xA)i/n+xA, (yD-yA)j/n+yA)$$

and in the case of a rectangle, $$(x(0, j), y(0, j))=(xB, (yA-yB)j/m+yB)$$

$$(x(n, j), y(n, j))=(xC, (yD-yC)j/m+yC)$$

$$(x(i, 0), y(i, 0))=(xC-xB)i/n+xB, yB)$$

$$(x(i, m), y(i, m))=(xD-xA)i/n+xA, yA)$$

$$\Delta\theta fi=(VA1, VB1)$$

$$VA1=(y(i, m)-y(i, 0))(x'(i, m))-x'(i, 0))+(y'(i, m)-y'(i, 0))(x(i, m)-x(i, 0))$$

$$VB1=(y(i, m)-y(i, 0))(y'(i, m))-y'(i, 0))+(x(i, m)-x(i, 0))(x'(i, m)-x'(i, 0))$$

$$\Delta\theta fi+1=(VA2, VB2)$$

$$VA2=(y(i+1, m)-y(i+1, 0))(x'(i+1, m)-x'(i+1, 0))+(y'(i+1, m)-y'(i+1, 0))(x(i+1, m)-x(i+1, 0))$$

$$VB2=(y(i+1, m)-y(i+1, 0))(y'(i+1, m)-y'(i+1, 0)+(x(i+1, m)-x(i+1, 0))(x'(i+1, m)-x'(i+1, 0))$$

$$\Delta\theta gi=(VA3, VB3)$$

$$VA3=(y(n, j)-y(0, j))(x'(n, j)-x'(0, j))+(y'(n, j)-y'(0, j))(x(n, j)-x(0, j))$$

$$VB3=(y(n, j)-y(0, j))(y'(n, j))-y'(0, j))+(x(n, j)-x(0, j))(x'(n, j)-x'(0, j))$$

$$\Delta\theta gi+1=(VA4, VB4)$$

$$VA4=(y(n, j+1)-y(0, j+1))(x'(n, j+1)-x'(0, j+1))+(y'(n, j+1)-y'(0, j+1))(x(n, j+1)-x(0, j+1))$$

$$VB4=(y(n, j+1)-y(0, j+1))(y'(n, j+1)-y'(0, j+1))+(x(0, j+1)-x(n, j+1))(x'(n, j+1)-x'(0, j+1)) \quad \text{(Equation 3)}$$

Thus, by the use of (Equation 1), (Equation 2) and (Equation 3) the correction values $\epsilon x(i, j)$, $\epsilon y(i, j)$ and $\epsilon\theta$ (i, j) of the fragmented cell S (i, j) can be obtained from the coordinates of the detected recognition marks A', B', C' and D' by calculation.

FIG. 4 shows the contents of a mounting data table in a preferred embodiment of the present invention, and FIG. 5 shows the contents of a correction data table in the preferred embodiment of the present invention.

As shown in FIG. 4, the mounting data table includes mounting coordinates (x, y), mounting angles $\psi$ and the like for each respective mounting sequence number.

These coordinates (x, y) and mounting angles $\psi$ indicate the values when the positional relations are established in an ideal manner as in the master substrate 4.

Once information on a mounting coordinate (x, y) is provided, the cell R (i, j) where the coordinate (x, y) is located can be identified. Hence, a data section for cell subscripts (i, j) is provided to store the information on the subscript (i, j) of the cell where a specific mounting cordinate (x, y) falls on.

Then, as shown in FIG. 5, correction data $\epsilon x$ (i, j), $\epsilon y$ (i, j) and $\epsilon\theta$ (i, j) for each respective cell S (i, j) can be obtained from the equations as described in the above and are stored in the correction data table 10 according to a two dimensional arrangement of subscripts i and j.

Next, with reference to FIG. 6, an explanation will be made on how each respective value of the mounting data table 9 and correction data table 10 is utilized after these tables 9 and 10 have been completed.

First, when a mounting sequence number SN is provided to the mounting data table 9 from the controller 6, the mounting data (x, y, $\psi$) corresponding to the mounting sequence number SN are read from the mounting data table 9.

Also, since the information on the subscripts (i, j) corresponding to the mounting sequence number SN calls for a cell S (i, j) in the correction data table 10, (which means a mounting operation takes place in the cell S (i, j)) the correction values ($\epsilon x$, $\epsilon y$, $\epsilon\theta$) at the designated cell S (i, j) are read from the correction data table 10. The mounting data (x, y, $\psi$) are combined with the correction data ($\epsilon x$, $\epsilon y$, $\epsilon\theta$) in the controller 6 to produce corrected mounting data (X, Y, $\theta$)(, where X=x+$\epsilon x$, Y=y+$\epsilon y$ and $\theta$=$\psi$+$\epsilon\theta$)), which are inputted to the driver 8.

Figure 7:
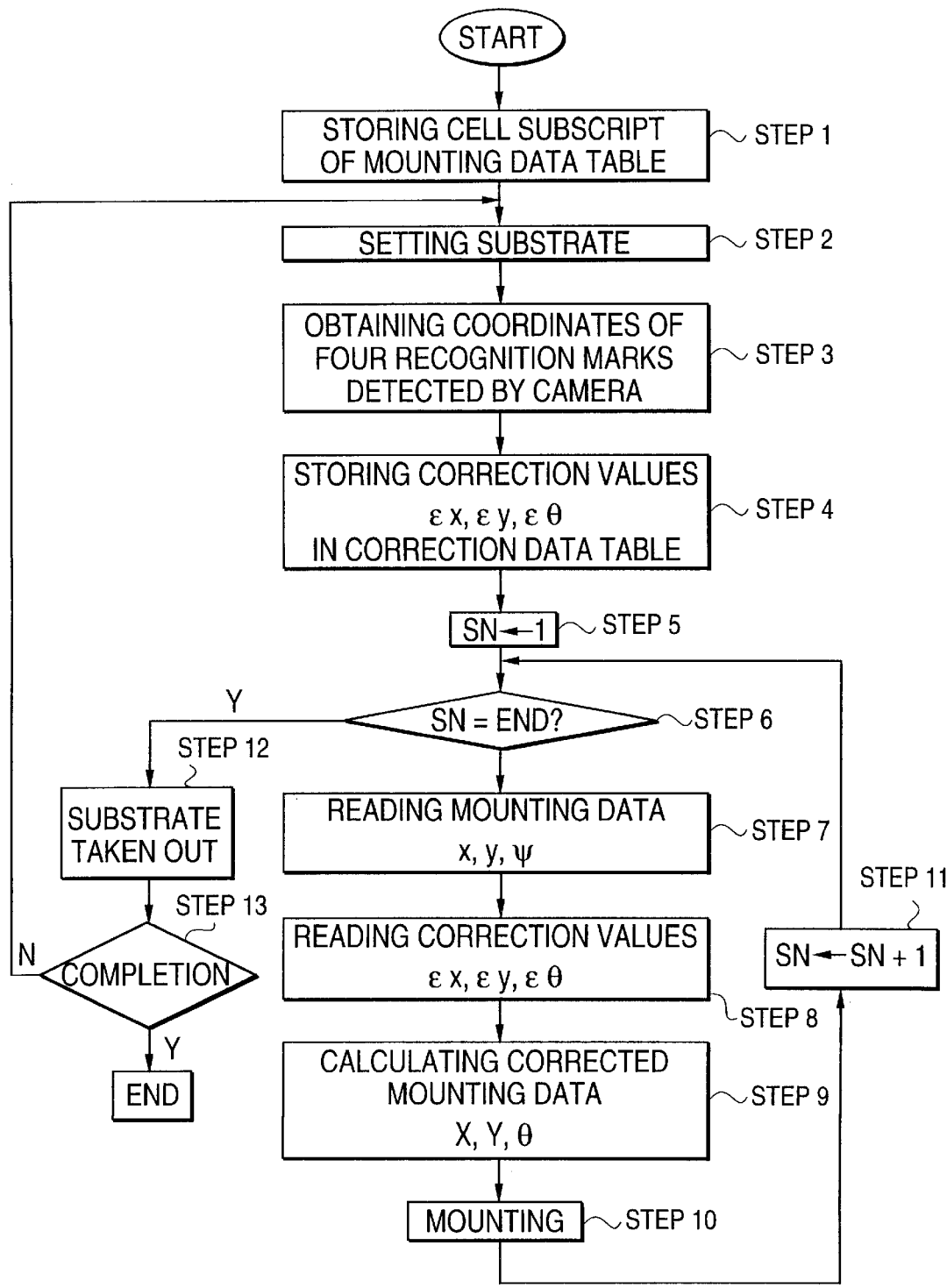
FIG. 7 is a flow chart of an electronic components mounting machine in a preferred embodiment of the present invention.
Figure 8:
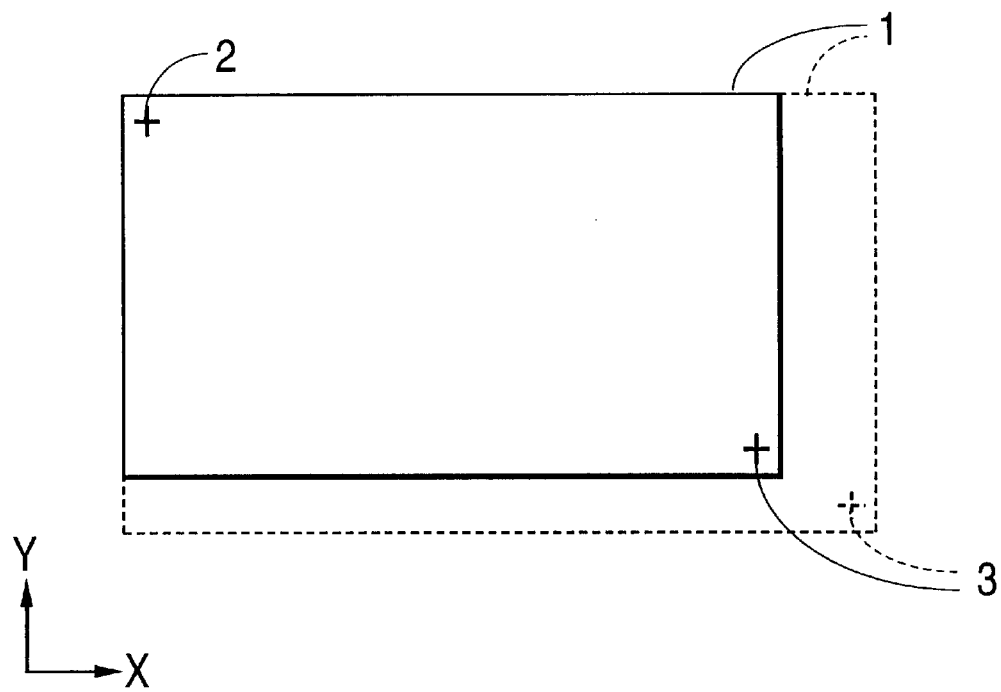
FIG. 8(a) and FIG. 8(b) describe correction values required of a prior art electronic components mounting machine.
Figure 8:
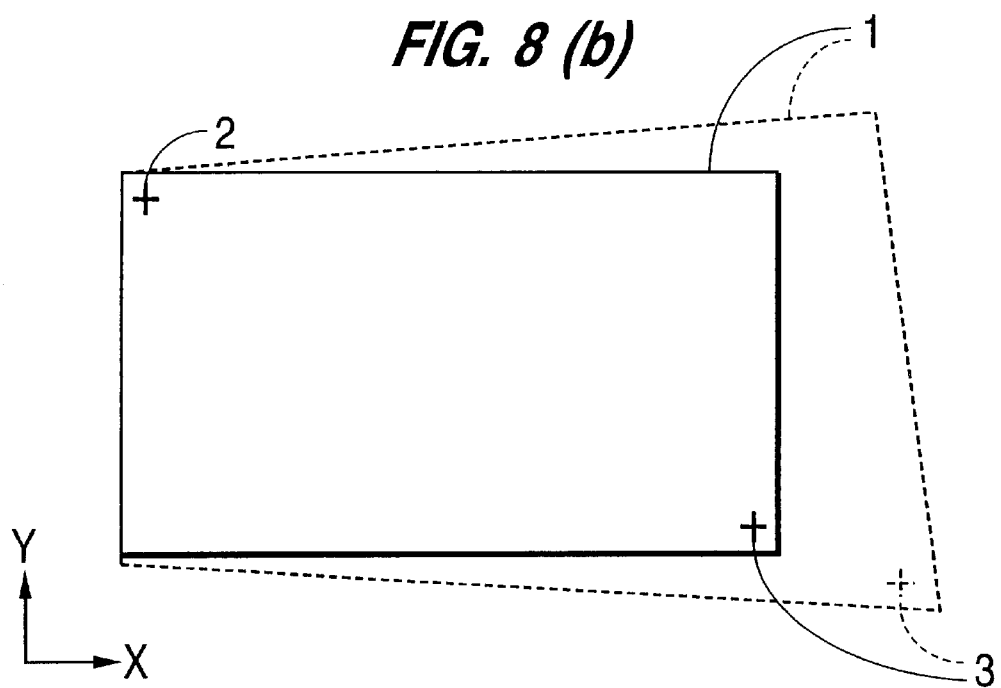

Next, a flow of operational steps of an electronic components mounting machine in the present exemplary embodiment will be explained with reference to FIG. 7.

First, according to dividing numbers m and n, a master substrate 4 is divided into cells and information on subscripts (i, j) that correspond to each respective cell is stored in each respective section of a mounting data table 9. (Step 1) Then, a substrate 11 (where electronic components are actually mounted) is set up under a camera 5. (Step 2)

A measurement of each respective coordinate of recognition marks A', B', C' and D' is performed by the camera 5. (Step 3)

The substrate 11 is also divided into cells of S (i, j) and information on correction values $\epsilon x(i, j)$, $\epsilon y(i, j)$ and $\epsilon\theta(i, j)$ applicable to each respective cell of S (i, j) is stored in a correction data table 10. (Step 4)

Next, the mounting sequence number SN is reset to 1 by a controller 6 (Step 5) and it is confirmed that the mounting sequence number SN has not reached the last mounting sequence number END. (Step 6)

Figure 6:
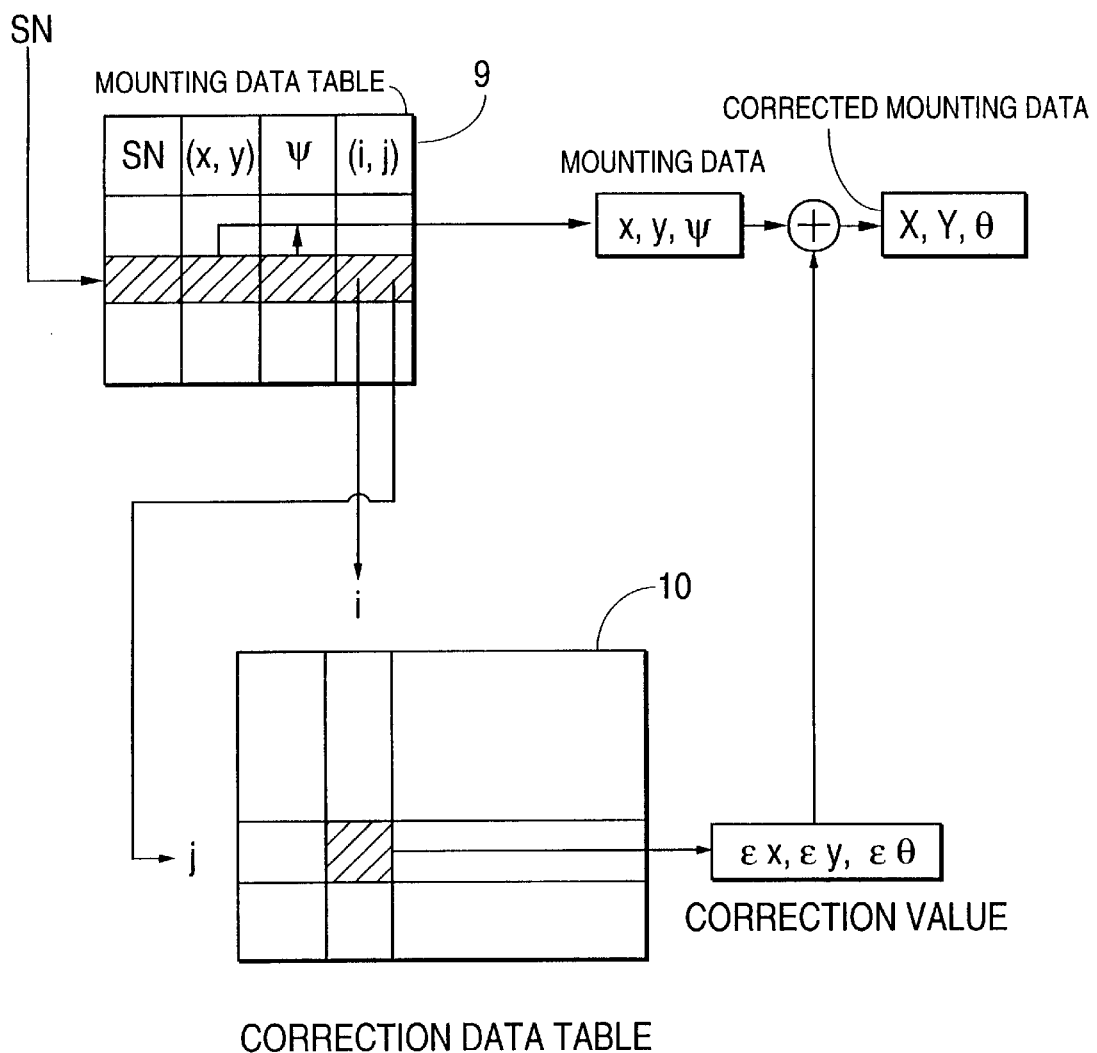
FIG. 6 is a chart to show the relationship between tables in a preferred embodiment of the present invention.

Then, as described in FIG. 6, follow the procedures of reading the information on mounting data x, y and /, and also correction values $\epsilon x$, $\epsilon y$ and $\epsilon\theta$, (Steps 7 and 8), obtaining corrected mounting data X, Y and $\theta$ by calculation, (Step 9), and mounting electronic components according to the corrected mounting data X, Y and $\theta$. (Step 10)

More specifically, corrections take place for each respective cell that has been formed by dividing the substrate 11 into small sections, thereby resulting usually in a different correction value for each respective cell.

Therefore, a precise mounting operation can be realized by applying very fine calibrations to the mounting coordinates and the like.

The procedures of Step 7 to Step 11 are repeated by having the mounting sequence number SN increased by one (Step 11) until the mounting sequence number SN reaches the last mounting sequence number END. (Step 6)

When the mounting operation of electronic components on the substrate 11 is finished, the substrate 11 is taken out, (Step 12), and the mounting operation of electronic components on another substrate of the same kind is resumed. (Step 13)

It is needless to say that the method of mounting electronic components on a substrate employing the same correction method as described in the above can be used even when recognition marks are located at more than four places, the pattern formed by connecting the positions occupied by recognition marks is not a rectangle, and the positions occupied by recognition marks coincide with the corners of a regular polygon or a pattern formed by combining regular polygons.

The coordinate system, whereby corrections in mounting positions are performed, can also adopt a coordinate system wherein the X and Y coordinate axes cross each other making a slanting angle instead of a right angle.

Also, an inclination against a specific coordinate axis can be used in place of an angle for defining the corrections in mounting positions.

POSSIBLE APPLICATIONS OF THE INVENTION IN THE INDUSTRY

An electronic components mounting machine of the present invention comprises an actuator whereby electronic components are mounted on a substrate, a detector whereby recognition marks located on the substrate at four positions at least are detected and the coordinates of these recognition marks are measured, a controller whereby the actuator is controlled, a mounting data table wherein information on mounting coordinates and angles for mounting electronic components is stored and a correction data table wherein information on correction values in mounting coordinates and angles for the substrate to be mounted with electronic components is stored, and has Provision for the correction data table to store information on correction values individually for a plurality of cells that are formed by dividing the substrate into small sections according to a specified rule with a basis placed on the coordinates of the recognition marks detected by the detector and also for the information on the mounting coordinates and angles stored in the mounting data table to get adjusted by the correction values specifically stored in the correction data table for each respective cell to be mounted with a specific electronic component, thus allowing the electronic components mounting operation to be performed in a finely adjusted manner by accommodating the factor of deformations of the substrate and realizing precise mounting of electronic components on a substrate even when the substrate is nonuniformly deformed.

What is claimed is:

1. A mounting method of electronic components comprising the steps of:

obtaining a correction value for each of a plurality of cells, said plurality of cells formed by dividing a substrate into a plurality of small sections according to a predefined rule, said correction values based on at least four recognition marks that are provided on said substrate; and mounting electronic components on said substrate by applying said correction values to mounting coordinates and mounting angles corresponding to electronic components mounted on an ideally formed substrate.

2. The mounting method of electronic components according to claim 1, wherein actual measurements made on a master substrate that has no deformation are used as standard values, on which said correction values are based.

3. The mounting method of electronic components according to claim 1, wherein design values are used as standard values, on which said correction values are based.

4. The mounting method of electronic components according to claim 1, wherein corrected mounting coordinates are expressed according to a rectangular-coordinate system.

5. The mounting method of electronic components according to claim 1, wherein corrected mounting angles are expressed by angles which form with a specified reference line.

6. The mounting method of electronic components according to claim 1, wherein said each of said plurality of cells formed by dividing said substrate into a plurality of small sections according to a specified rule is a rectangle.

7. A method of mounting components on a substrate, said method comprising the steps of:

partitioning a master substrate so as to define a plurality of cells, said master substrate having at least four recognition marks formed thereon, said master substrate being free from defects, partitioning a second substrate so as to define the same plurality of cells as said master substrate, said second substrate having the same recognition marks as said master substrate, generating and storing a mounting data table, said mounting data table containing information on mounting coordinates and mounting angles of components mounted on said master substrate, detecting location coordinates for each of said at least four recognition marks formed on said second substrate, generating correction values for each of said plurality of cells of said second substrate, said correction values generated from the location coordinates of said recognition marks, storing said correction values for each of said plurality of cells in a correction data table, calculating corrected mounting data for each of said plurality of cells of said second substrate in which a component is to be mounted, said corrected mounting data calculated utilizing said correction values, mounting said components on said second substrate, each component designated to be mounted in a given cell of said plurality of cells being mounted in accordance with the corrected mounting data corresponding to said given cell.

8. An electronic components mounting machine comprising:

an actuator for mounting electronic components on a substrate;

a detector for detecting coordinates of recognition marks formed on said substrate, at least four recognition marks formed on said substrate;

a controller coupled to said actuator and said detector, said controller operable for controlling said actuator and said detector;

means for storing a mounting data table, said mounting data table containing information on mounting coordinates and mounting angles of electronic components to be mounted on said substrate; and means for storing a correction data table, said correction data table containing information on correction values to be applied to said mounting coordinates and mounting angles, said correction data table storing information on correction values for each of a plurality of cells, said plurality of cells formed by dividing said substrate into a plurality of small sections according to a predefined rule, each of said small sections corresponding to a given cell, said correction values based on said coordinates of said recognition marks detected by said detector, said controller enabling said actuator to mount said each respective electronic component in accordance with the information on said mounting coordinates and mounting angles stored in said mounting data table after the information is corrected according to said information on correction values stored in said correction data table for each respective cell in which a corresponding electronic component is mounted.

9. The electronic components mounting machine according to claim 1, wherein actual measurements made on a master substrate that has no deformation are used as standard values, on which said correction values are based.

10. The electronic components mounting machine according to claim 1, wherein design values are used as standard values, on which said correction values are based.

11. The electronic components mounting machine according to claim 1, wherein the detector for detecting recognition marks is a video camera.

12. The electronic components mounting machine according to claim 1, wherein corrected mounting coordinates are expressed according to a rectangular-coordinate system.

13. The electronic components mounting machine according to claim 1, wherein corrected mounting angles are expressed by angles which form with a specified reference line.

14. The electronic components mounting machine according to claim 1, wherein said each of said plurality of cells formed by dividing said substrate into a plurality of small sections according to a specified rule is a rectangle.

* * * * *